US010080317B2

(12) United States Patent
Toleno et al.

(10) Patent No.: US 10,080,317 B2
(45) Date of Patent: Sep. 18, 2018

(54) POLYMERIC ELECTROMAGNETIC SHIELD FOR ELECTRONIC COMPONENTS

(71) Applicant: Microsoft Technology Licensing, LLC, Redmond, WA (US)

(72) Inventors: Brian J. Toleno, Cupertino, CA (US); Igor Markovsky, San Jose, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/197,624

(22) Filed: Jun. 29, 2016

(65) Prior Publication Data

US 2018/0007818 A1  Jan. 4, 2018

(51) Int. Cl.
| | | |
|---|---|---|
| *H05K 7/00* | (2006.01) | |
| *H05K 9/00* | (2006.01) | |
| *H05K 1/11* | (2006.01) | |
| *H05K 3/28* | (2006.01) | |
| *H05K 3/40* | (2006.01) | |
| *H05K 3/46* | (2006.01) | |

(52) U.S. Cl.
CPC ............ *H05K 9/0081* (2013.01); *H05K 1/11* (2013.01); *H05K 3/28* (2013.01); *H05K 3/4007* (2013.01); *H05K 3/4644* (2013.01); *H05K 9/003* (2013.01); *H05K 2201/0715* (2013.01)

(58) Field of Classification Search
CPC ........ C08K 9/04; C08G 59/58; C08G 59/245; C09D 5/24; C09D 7/1225; C09D 7/1291; C09D 163/00; H05K 1/11; H05K 1/0218; H05K 3/28; H05K 3/284; H05K 3/4007; H05K 3/4644; H05K 9/003; H05K 9/0039; H05K 9/0079; H05K 9/0081; H05K 9/008; H05K 2001/0715; H05K 2201/0367; H05K 2201/0715; H01L 23/552; H01L 2224/16225
USPC ............................ 174/35; 361/760; 427/8, 58
See application file for complete search history.

(56) References Cited

U.S. PATENT DOCUMENTS

| | | | |
|---|---|---|---|
| 5,639,989 A * | 6/1997 | Higgins, III | .......... H01L 23/552 174/386 |
| 6,288,344 B1 | 9/2001 | Youker et al. | |
| 8,156,644 B2 | 4/2012 | Babb et al. | |
| 8,790,962 B2 | 7/2014 | Pagaila et al. | |
| 8,847,184 B2 | 9/2014 | Cheng et al. | |
| 9,196,588 B2 | 11/2015 | Leal | |
| 9,196,958 B2 * | 11/2015 | Arnold | .................. H01Q 1/526 |

(Continued)

OTHER PUBLICATIONS

"Soft Ferrite Powders for Electronics", Published on: May 1, 2015 Available at: http://www.pptechnology.com/electronic-soft-ferrite-powders.html.

*Primary Examiner* — Sherman Ng
*Assistant Examiner* — Guillermo Egoavil
(74) *Attorney, Agent, or Firm* — Arent Fox LLP

(57) ABSTRACT

An electronic device can include a circuit board, an electronic component mounted on the circuit board, a conductive contact disposed (e.g., deposited) on the circuit board, and a shielding polymer layer deposited over the electronic component. The shielding polymer layer includes a network of conductive pathways formed from sintered particles. The network of conductive pathways is electrically coupled to the conductive contact, which can be configured for connection to a power source ground. As such, the network of conductive pathways enables electromagnetic shielding of the electronic component.

17 Claims, 5 Drawing Sheets

(56) References Cited

U.S. PATENT DOCUMENTS

| | | | |
|---|---|---|---|
| 2001/0033478 A1 | 10/2001 | Ortiz et al. | |
| 2004/0231872 A1* | 11/2004 | Arnold | H01L 23/04 |
| | | | 174/377 |
| 2007/0071886 A1 | 3/2007 | Babb et al. | |
| 2009/0008706 A1 | 1/2009 | Yedinak et al. | |
| 2010/0315105 A1* | 12/2010 | Fornes | C09D 7/62 |
| | | | 324/693 |
| 2011/0156225 A1 | 6/2011 | Hozoji et al. | |
| 2011/0318481 A1 | 12/2011 | Chung et al. | |
| 2014/0239464 A1 | 8/2014 | Chung et al. | |
| 2014/0332937 A1* | 11/2014 | Brunnbauer | H01L 21/561 |
| | | | 257/659 |
| 2015/0271959 A1 | 9/2015 | Chen et al. | |
| 2015/0348936 A1 | 12/2015 | Lin et al. | |
| 2016/0066481 A1* | 3/2016 | Malek | H05K 9/0032 |
| | | | 361/760 |

\* cited by examiner

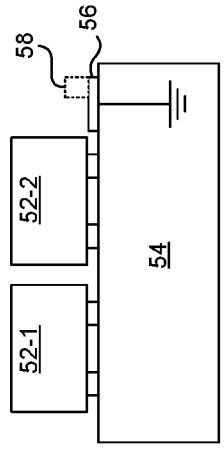
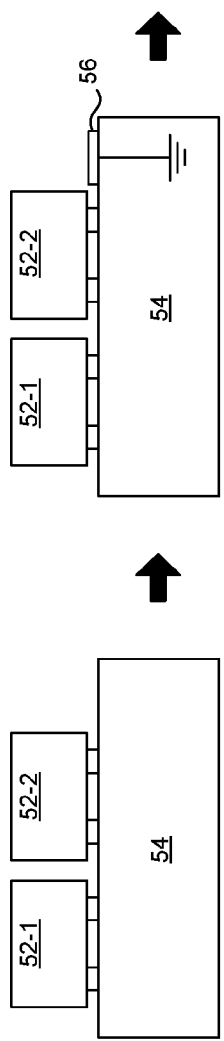
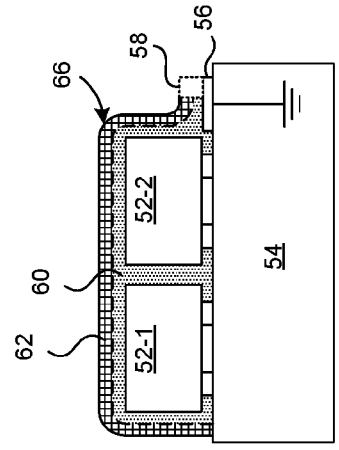
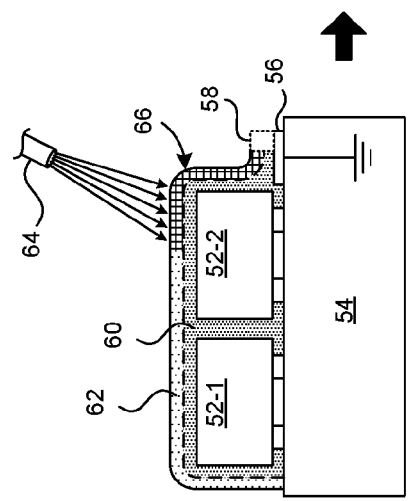
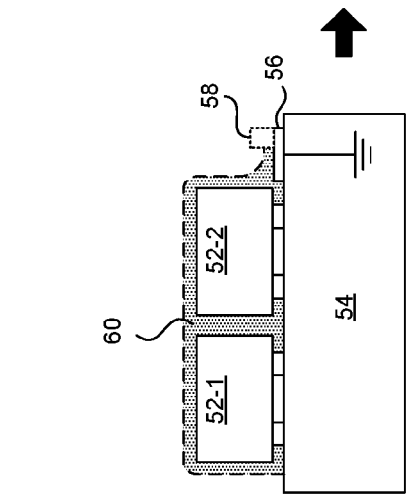
FIG. 4A  FIG. 4B  FIG. 4C
FIG. 4D  FIG. 4E  FIG. 4F

POLYMERIC ELECTROMAGNETIC SHIELD FOR ELECTRONIC COMPONENTS

BACKGROUND

Electronic components such as integrated circuits are found ubiquitously in modern consumer and industrial products. Many electronic components are sensitive to interference from electromagnetic (EM) radiation, or EM interference (EMI), particularly, though not exclusively, from radio frequency (RF) radiation. EMI can cause an electronic component to malfunction, which can cause the device in which the component is included to fail. Sources of EM radiation may include other nearby electronic components in the same device or sources external to the device.

Consequently, some form of EM shielding is needed for many common electronic components. Typical EM shields are structures that include a metal housing manually soldered onto pads on a circuit board. The metal housing encloses the sensitive electronic components, and the pads are electrically grounded. As such, the EM shield creates a Faraday cage around the sensitive electronic component(s). This EM shield can protect sensitive circuitry from a myriad of signals generated close to and remote from the sensitive circuitry.

The metal housing typically used for EM shielding is a bulky metal structure designed specifically for circuit board designs. As such, each circuit board design requires a uniquely sourced and designed EM shield, which can add to the cost of the product. Further, the metal housing can be difficult to solder onto pads of a circuit board. Moreover, the shield adds weight and volume to the product in which it is incorporated, which may be undesirable. Accordingly, existing EM shields have limited usefulness in electronic devices that are complex, portable, relatively small, and/or lightweight.

One approach to addressing these drawbacks includes forming a multilayer rigid shield over the sensitive electronic components by first pouring a liquid filler material over the sensitive components, allowing it to cool and solidify, and then pouring a liquid conductive material over the solid filler layer. The conductive material solidifies upon cooling to form a solid conductive layer, which is then electrically grounded. This multilayered structure forms a rigid EM shield that, unlike the bulkier metal housing, cannot be removed to repair or replace an enclosed electronic component. Other solutions include placing protective films over the sensitive electronic components. However, such films typically provide inadequate EM shielding.

SUMMARY

The technique introduced here includes at least one apparatus and at least one method, where the apparatus in certain embodiments includes at least one electronic device, and the method in certain embodiments is a method of fabricating an electronic device. The electronic device introduced here provides electromagnetic (EM) shielding of an electronic component and can be manufactured using automated processes.

In some embodiments, the electronic device can include a circuit board, an electronic component mounted on the circuit board, and a conductive contact disposed (e.g., deposited) on the circuit board. The conductive contact can be configured for connection to a power source ground. The electronic device can include a shielding polymer layer deposited over the electronic component and including a network of conductive pathways formed from sintered particles, the network of conductive pathways being electrically coupled to the conductive contact.

In certain embodiments, an electrically insulating polymer layer (hereinafter "insulating polymer layer") is deposited between the shielding polymer layer and the electronic component, such that the insulating polymer layer electrically insulates the electronic component from the shielding polymer layer.

In certain embodiments, methods of fabricating the electronic device can include applying a sinterable polymer layer over an electronic component mounted to a circuit board and forming a network of conductive pathways by using electromagnetic energy to sinter sinterable particles of the sinterable polymer layer. The network of conductive pathways is electrically coupled to a conductive contact on the circuit board thereby forming a shielding polymer layer.

In certain embodiments, an insulating polymer layer can be applied over the electronic component such that the insulating polymer layer electrically insulates the electronic component from the shielding polymer layer.

Other aspects of the technique will be apparent from the accompanying figures and detailed description.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

One or more embodiments of the present disclosure are illustrated by way of example and not limitation in the figures of the accompanying drawings, in which like references indicate similar elements.

FIG. 4A shows a side view of electronic components mounted to a circuit board of an electronic device.

FIG. 4B shows a side view of the electronic device in FIG. 4A including a conductive contact on the circuit board.

FIG. 4C shows a side view of the electronic device in FIG. 4B including an electrically conductive pillar located atop the conductive contact.

FIG. 4D shows a side view of the electronic device in FIG. 4C including an electrically insulating polymer layer (hereinafter "insulating polymer layer") deposited over the electronic components.

FIG. 4E shows a side view of the electronic device in FIG. 4D including a sinterable polymer layer deposited over the insulating polymer layer, and an external energy source used to sinter the sinterable polymer layer.

FIG. 4F shows a side view of the electronic device in FIG. 4E including the shielding polymer layer and the insulating polymer layer enclosing the electronic components.

DETAILED DESCRIPTION

In this description, references to "an embodiment," "one embodiment," or the like, mean that the particular feature, function, structure or characteristic being described is included in at least one embodiment of the technique introduced here. Occurrences of such phrases in this specification do not necessarily all refer to the same embodiment. On the other hand, the embodiments referred to also are not necessarily mutually exclusive.

The following description generally includes an electronic component mounted on a circuit board or other kind of circuit substrate of an electronic device. The electronic device includes a polymeric structure that shields the electronic component from electromagnetic (EM) radiation. For example, the polymeric structure can shield the electronic component from radio-frequency (RF) EM radiation and/or EM interference (EMI) radiation.

FIGS. 1A through 3B and related text describe certain embodiments of electronic devices (e.g., consumer electronic devices) including polymeric structures that can shield an electronic component from EM radiation. However, the disclosed embodiments are not limited to electronic devices and have a variety of possible applications, including forming any polymeric structure that can attenuate EM radiation. For example, cables coated with the disclosed polymeric structure can be isolated from an environment through which the cables run to prevent EM radiation from escaping or penetrating the cables. All such applications, improvements, or modifications are considered within the scope of the concepts disclosed herein. Additionally, while this description generally assumes the use of a circuit board as the mounting substrate for the component(s) to be protected, it is contemplated that the techniques introduced here could be applied to protect components on other types of substrates, such as a semiconductor chip substrate, thermoplastic substrate, polyimide flex circuit, etc.

Figure 1A:
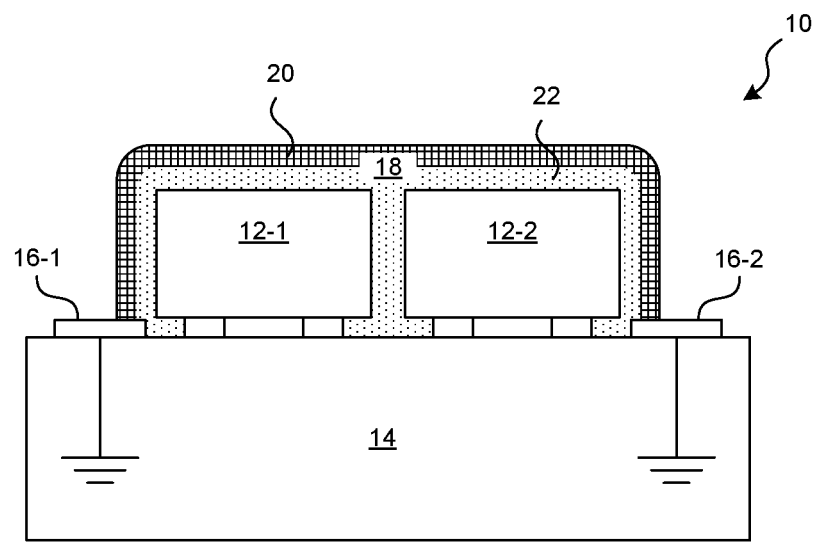
FIG. 1A shows a side view of an electronic device including a single layer polymeric structure that enables electromagnetic (EM) shielding of electronic components according to an embodiment.
Figure 1B:
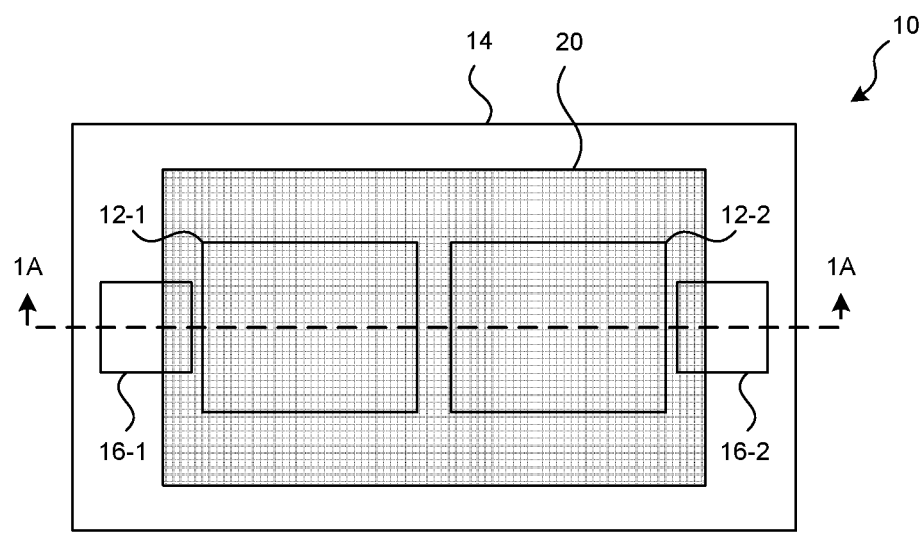
FIG. 1B shows a top view of the electronic device of FIG. 1A.

FIG. 1A shows a side view of an electronic device including a single layer polymeric structure that enables EM shielding of electronic components according to an embodiment. FIG. 1B shows a top view of the electronic device of FIG. 1A. In the illustrated example, electronic device 10 represents any device that includes an electronic component 12-1 or 12-2 (also referred to collectively as electronic components 12). Examples of common electronic components include integrated circuits, capacitors, inductors, resistors, diodes, transistors, and the like.

The electronic components 12 can be mounted on a circuit board 14 by using standard techniques including design guidelines, equipment, and processes used to form circuitry. For example, the electronic components 12 can be soldered to a circuit board 14 that interconnects the electronic components 12 to form an electronic circuit (e.g., an amplifier, radio receiver, or oscillator). A common example includes a printed circuit board that can mechanically support and electrically connect electronic components using conductive tracks, pads, and other features etched from metal sheets laminated onto a non-conductive substrate to form an electronic circuit on a circuit board.

The electronic device 10 includes conductive contacts 16-1 and 16-2 (also referred to collectively as conductive contacts 16) that can be deposited on the circuit board 14. The conductive contacts 16 can be located anywhere on the circuit board 14 and can have any desired shape or size as long as the conductive contacts 16 are connectable to a ground node of a power source. As such, the conductive contacts 16 are electrically grounded when the electronic device 10 is powered on. Examples of the conductive contacts 16 include metal contact pads, which are designated conductive surface areas commonly found on a circuit board 14 or die of an integrated circuit.

The electronic device 10 also includes a polymeric structure, which is a single shielding polymer layer 18 deposited over the electronic components 12. As shown, the shielding polymer layer 18 is in physical contact with the electronic components 12. The shielding polymer layer 18 includes a mesh of interconnected, discrete conductive pathways that form a network of conductive pathways 20. The network of conductive pathways 20 is produced from sinterable particles that have been sintered according to a process detailed further below.

The network of conductive pathways 20 can be included in all or any portion of the shielding polymer layer 18 as long as the electronic components 12 are insulated from the network of conductive pathways 20. For example, the network of conductive pathways 20 can be formed on a surface of the shielding polymer layer 18. The network of conductive pathways 20 is electrically coupled to the conductive contacts 16. The shielding polymer layer 18 also includes an insulating portion 22 that insulates the network of conductive pathways 20 from the electronic components 12.

For example, a portion (e.g., insulating portion 22) of the shielding polymer layer 18 between the network of conductive pathways 20 and the electronic components 12 can include non-conductive sinterable particles, which were not sintered to form conductive pathways. As such, the network of conductive pathways 20 is electrically insulated from the electronic components 12. As a result, the network of conductive pathways 20 is an electrically conductive portion of the shielding polymer layer 18 that is electrically grounded via the conductive contacts 16 and insulated from the electronic components 12.

In certain embodiments, the network of conductive pathways 20 can define a space that electromagnetically encloses the electronic components 12 from an external environment. Specifically, the network of conductive pathways 20 can span the entire surface area of the shielding polymer layer 18, which can physically enclose the electronic components 12. The network of conductive pathways 20 can be electrically grounded through the conductive contacts 16 when coupled to a source having a ground voltage level. As a result, the network of conductive pathways 20 can function to prevent or reduce EM radiation from exiting or entering the enclosed space formed by the shielding polymer layer 18. Hence, the network of conductive pathways 20 enables EM shielding for the electronic components 12. For example, the network of conductive pathways 20 can block radio frequency (RF) EM radiation to provide RF shielding.

In certain embodiments, the shielding polymer layer 18 can include a thermally conductive filler that facilitates thermal conductivity between the electronic components 12 and the ambient environment. As such, heat generated by the electronic components 12 can dissipate through the shielding polymer layer 18 to the ambient environment, which facilitates cooling of the electronic device 10. In certain embodiments, the thermally conductive filler can include aluminum oxide, aluminum nitride, boron nitride, diamond-based material, or a combination of these materials.

The network of conductive pathways 20 is produced from non-electrically conductive sinterable particles that have been sintered with an energy source in accordance with a process detailed further below. As such, the sintered particles are said to be "activated" from sinterable particles. For example, a sinterable particle can have a non-conductive coating that insulates a conductive core. The conductive core can include a metal such as copper, nickel, gold, or an alloy. Removing the non-conductive coating from the sinterable particle is said to "activate" the sinterable particle because the conductive core is exposed. Accordingly, sintering a sinterable particle can refer to using energy to remove its non-conductive coating from its conductive core.

Specifically, a necessary and sufficient amount of energy can remove a non-conductive coating from the conductive core of a sinterable particle. Hence, effectively sintering sinterable particles can depend on properties of the sinterable particles that determine the sufficient amount of energy necessary to dissolve the coating. Thus, producing the shielding polymer layer 18 can involve energizing sinterable particles with a necessary and sufficient amount of energy to remove their coatings and expose their conductive cores, which can then collectively coalesce to form conductive pathways of the network of conductive pathways 20.

For example, the shielding polymer layer 18 can be created from a polymer doped with sinterable particles that are activated with a laser beam. In particular, the laser beam can be used to draw a trace of conductive material from sintered particles on the polymer in accordance with a path where the laser beam hits the polymer. The conductive trace can form a conductive pathway on the polymer. A mesh of interconnected conductive pathways created in this manner can form the network of conductive pathways 20. Any number of successive layers of conductive material can be created this way in the polymer to form the shielding polymer layer 18.

Examples of types of EM energy sources that can produce sufficient energy to sinter sinterable particles include visible light or light outside the visible spectrum such as ultraviolet light or infrared light. Other types of EM energy sources that can be used to sinter sinterable particles include x-rays, microwaves, or the like. An EM energy source can be focused (e.g., a laser beam) or unfocused. For example, a bulk surface area of the polymeric structure can be exposed to an energy source to produce a uniform conductive surface that occupies the bulk surface area (rather than discrete pathways) of the polymeric structure.

However, use of a focused EM energy source such as a laser beam provides flexibility to draw precise conductive pathways for the shielding polymer layer 18. In other words, focused EM energy can be used to produce interconnected, discrete pathways that form the network of conductive pathways 20. In certain embodiments, use of focused EM energy enables drawing interconnected conductive pathways in accordance with a pattern. As such, the network of conductive pathways 20 of the shielding polymer layer 18 can be drawn in a precise pattern. The pattern of the network of conductive pathways 20 can enable EM shielding of an electronic component 12-1 and/or 12-2 for a selected frequency range. In other words, the pattern formed by the network of conductive pathways 20 can define a selected frequency range shielded by the patterned network of conductive pathways 20.

The energy source used to sinter the sinterable particles is not limited to EM energy. For example, in certain embodiments, thermal energy can be used to activate the sinterable particles. In particular, the energy source could be an oven in which the electronic device 10 is placed prior to activating any sinterable particles of the shielding polymer layer 18. The heat from the oven can be set to provide sufficient thermal energy to form a uniform conductive layer on the surface of the shielding polymer layer 18, which does not extend to electrically contact the electronic components 12.

Figure 2A:
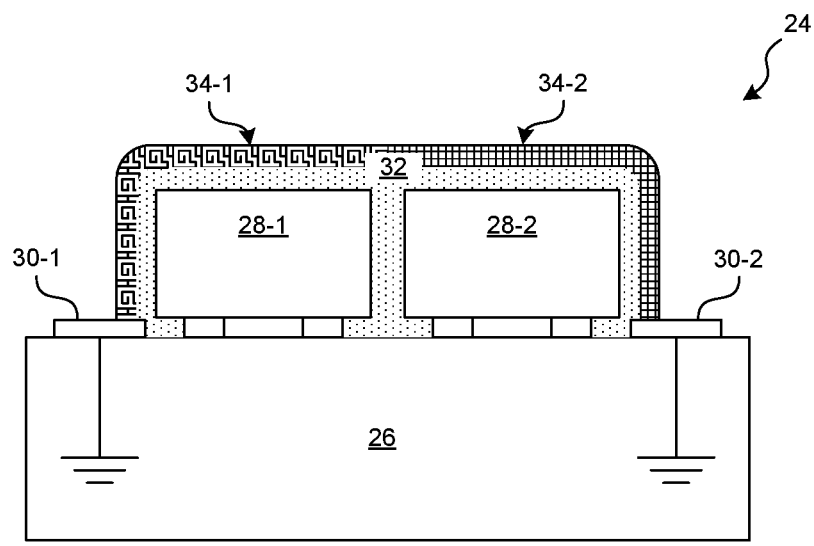
FIG. 2A shows a side view of an electronic device including a single layer polymeric structure that enables EM shielding of the electronic component according to another embodiment.
Figure 2B:
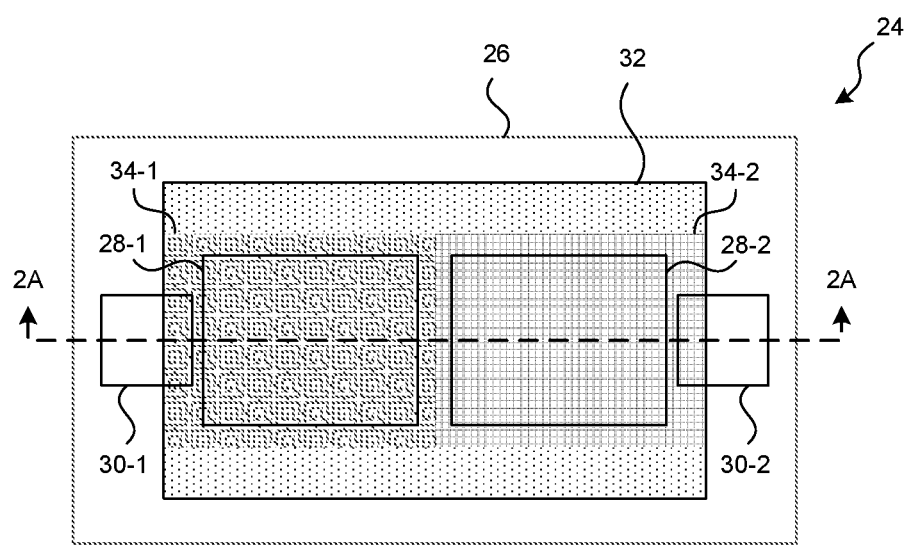
FIG. 2B shows a top view of the electronic device of FIG. 2A.

FIG. 2A shows a side view of an electronic device including a single layer polymeric structure that enables EM shielding of the electronic component according to another embodiment. FIG. 2B shows a top view of the electronic device of FIG. 2A. This illustrated example is similar to the illustrated example of FIGS. 1A and 1B. In particular, an electronic device 24 includes a circuit board 26, electronic components 28 mounted on the circuit board 26, and conductive contacts 30 deposited on the circuit board 26. The conductive contacts 30 are configured for connection to a power source ground. The electronic device 24 also includes a single shielding polymer layer 32 deposited over the electronic components 28.

The shielding polymer layer 32, however, includes two distinct networks of conductive pathways 34-1 and 34-2 (referred to collectively as networks of conductive pathways 34) formed from sintered particles. The network of conductive pathways 34-1 spans a portion of a surface area of the shielding polymer layer 32 that substantially shields the electronic component 28-1. The network of conductive pathways 34-2 spans a portion of a surface area of the shielding polymer layer 32 that substantially shields the electronic component 28-2. Moreover, each of the networks of conductive pathways 34 spans a surface area that is less than the entire surface area of the shielding polymer layer 32. In fact, a portion of the total surface area of the shielding polymer layer 32 does not include any networks of conductive pathways. Hence, the networks of conductive pathways 34 occupy less than the entire surface area of the shielding polymer layer 32.

The distinct networks of conductive pathways 34 are electrically coupled to conductive contacts 30 (referred to individually as conductive contacts 30-1 and 30-2). In particular, the networks of conductive pathways 34-1 and 34-2 are electrically coupled to the conductive contacts 30-1 and 30-2, respectively. As such, each distinct network of conductive pathways 34 is electrically grounded via a respective conductive contact 30 to form a distinct EM shield for a respective electronic component 28.

The networks of conductive pathways 34-1 and 34-2 each have a pattern that provides EM shielding of the electronic components 28-1 and 28-2, respectively, with selected frequency ranges. In particular, the networks of conductive pathways 34-1 and 34-2 can form different patterns such that the electronic components 28-1 and 28-2 have EM shielding for selected frequencies of different ranges. Accordingly, the shielding polymer layer 32 can be customized to provide localized EM shielding from the same or different selected frequency ranges in accordance with the patterns of the networks of conductive pathways 34.

Figure 3A:
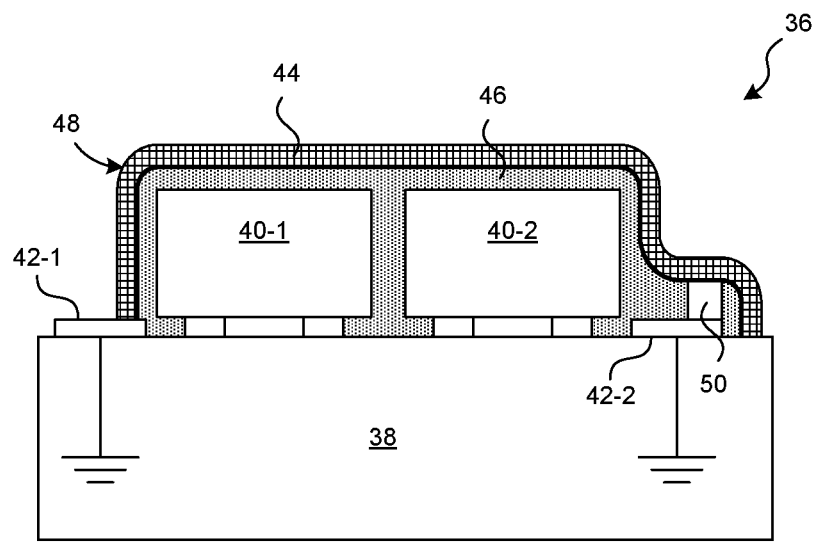
FIG. 3A shows a side view of an electronic device including a multilayer polymeric structure that enables EM shielding of the electronic component according to an embodiment.
Figure 3B:
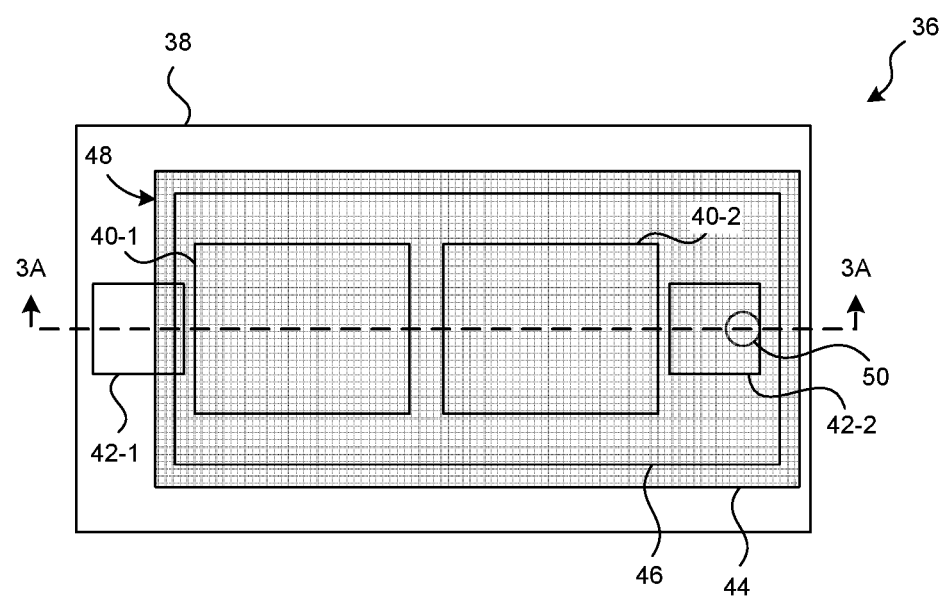
FIG. 3B shows a top view of the electronic device of FIG. 3A.

In certain embodiments, the polymeric structure that provides EM shielding may include multiple layers. For example, the polymeric structure can include any number of layers in addition to a shielding polymeric layer. The additional layers may provide added benefits and/or facilitate fabrication of electronic devices. For example, FIG. 3A shows a side view of an electronic device including a multilayer polymeric structure that enables EM shielding of the electronic component according to an embodiment. FIG. 3B shows a top view of the electronic device of FIG. 3A.

The illustrated example of FIGS. 3A and 3B includes features similar to the examples of FIGS. 1A through 2B. In particular, an electronic device 36 includes a circuit board 38, electronic components 40 mounted on the circuit board 38, and conductive contacts 42 deposited on the circuit board 38. The conductive contacts 42 are configured for connection to a power source ground.

The polymeric structure of the electronic device 36 includes a shielding polymer layer 44 deposited over the electronic components 40. In addition, the polymeric structure of the electronic device 36 includes an electrically insulating polymer layer 46 (hereinafter "insulating polymer layer 46") deposited between the shielding polymer layer 44 and the electronic components 40. The insulating polymer layer 46 electrically insulates the electronic components 40 from the shielding polymer layer 44. In certain embodiments, the insulating polymer layer 46 can be a non-conductive dielectric material.

The insulating polymer layer 46 can provide benefits in addition to improved insulation of the electronic components 40. For example, the insulating polymer layer 46 can include an adhesive that bonds the insulating polymer layer 46 to the shielding polymer layer 44 and the electronic components 40. As such, the insulating polymer layer 46 can improve the structural stability of the electronic device 36.

The insulating polymer layer 46 can include a thermally conductive filler that facilitates thermal conductivity between the electronic components 40 and an ambient environment. Examples of a thermal filler include aluminum oxide, aluminum nitride, boron nitride, diamond-based material, or combinations of these fillers. In certain embodiments, either or both the insulating polymer layer 46 and the shielding polymer layer 44 can include a thermal filler to improve cooling of the electronic components 40 by enhancing thermal conductance to an ambient environment.

Including the insulating polymer layer 46 as an additional layer in contact with the electronic components 40, but distinct from the shielding polymer layer 44, may improve the function of the EM shielding. In particular, the insulating polymer layer 46 does not include sinterable particles. Instead, sinterable particles are only included as an additive to a polymer layer that forms the shielding polymer layer 44. As such, a network of conductive pathways 48 can be formed to span the entire depth of the shielding polymer layer 44 without contacting the electrical components 40, which are insulated by the insulating polymer layer 46.

The multilayer polymeric structure of FIGS. 3A and 3B not only reduces the risk of inadvertently creating an electrical contact between the shielding polymer layer 44 and the electrical components 40, but also provides added flexibility to form a pattern of the network of conductive pathways 48 that can span deeper into the shielding polymer layer 44. As such, the shielding polymer layer 44 can be further customized to provide EM shielding of selected frequencies.

FIGS. 3A and 3B also show an additional structure for grounding the network of conductive pathways 48. Specifically, an electrically conductive pillar 50 is shown as a cylinder positioned atop the conductive contact 42-2. The pillar 50 can be formed of a metal or any type of conductive material. The pillar 50 is positioned between the conductive contact 42-2 and the network of conductive pathways 48 such that the network of conductive pathways 48 is electrically coupled to the conductive contact 42-2 through the pillar 50. In other words, the network of conductive pathways 48 physically contacts the pillar 50 and is electrically connected to the conductive contact 42-2 through the pillar 50, which physically contacts the conductive contact 42-2.

In certain embodiments, the pillar 50 can be a conductive contact that is raised from the circuit board 38 and can be connected directly to a power source ground. As such, the use of the pillar 50 can obviate a need for a conductive contact 42 because the pillar 50 itself could be electrically grounded to ground the network of conductive pathways 48 functioning as an EM shield.

The physical dimensions of a pillar may be such that the pillar forms a barrier that can contain one or more layers of a polymeric structure within an area of a circuit board. For example, multiple pillars can be used to form a dam that isolates insulating polymer layer 46 to a designated area of the circuit board 38. In certain embodiments, a pillar may be shaped as an elongated dam having a height equal to a height of an insulating polymer layer. As such, the dam-shaped pillar can act as a barrier to the insulating polymer layer when being poured onto electronic components. In certain embodiments, the pillar could be structured as a dam having a height equal to or greater than the sum of the heights of all the layers in a multilayer polymeric structure. As such, the dam-shaped pillar can act as a barrier to all the polymer layers when successively poured to form a polymeric structure.

The conductive contacts 42 and/or the pillar 50 can be located anywhere on the circuit board 38, provided the network of conductive pathways 48 can be electrically coupled to either the conductive contacts 42 and/or the pillar 50 to provide electrical grounding of the shielding polymer layer 44, which enables EM shielding of the electronic components 40. For example, the pillar 50 can be located at a periphery or perimeter of an area of the circuit board 38 that includes the shielding polymer layer 44. The locations of the conductive contacts 42 and/or the pillars 50 may be dictated based on the configuration of the electronic components 40 and/or the circuit board 38.

FIGS. 3A and 3B also show the network of conductive pathways 48 electrically coupled directly to the conductive contact 42-1, without an intervening conductive pillar. As such, the use of a conductive pillar is optional and may be dictated by a desired configuration of the electronic components 40 and/or the circuit board 38.

The embodiments of the electronic devices in FIGS. 1A through 3B include various features that can be combined in a variety of ways to achieve a desired EM shielding. For example, the pillar 50 can be used in any of electronic devices 10, 24, or 36, as desired for any particular application. Moreover, embodiments of the electronic devices can include any number of layers in any order to provide a desired EM shielding. For example, an electronic device can include three or more successively stacked layers of alternating insulating polymer layers and shielding polymer layers as needed to achieve a desired EM shielding of electronic components on a circuit board.

The disclosed electronic devices can include circuitry for computers or consumer electronics, which are augmented with a polymeric structure to provide EM shielding for electronic components of the circuitry. Standard techniques including design guidelines, equipment, and processes can be used to form the circuitry being shielded. These standard techniques are augmented to form the polymeric structure that augments the circuitry to enable EM shielding for the electronic components of the circuitry.

FIGS. 4A through 4F depict components successively combined to form an electronic device including a polymeric structure that provides EM shielding according to an embodiment. In particular, FIGS. 4A through 4C show side views of components successively combined to form circuitry for an electronic device. FIGS. 4D through 4F show side views of a polymeric structure incorporated into the circuitry of the electronic device to enable EM shielding of electronic components. Methods for fabricating the disclosed electronic devices are described further below, and could be better understood in light of the successive combination of components shown in FIGS. 4A through 4F.

FIG. 4A specifically shows electronic components 52 mounted on a circuit board 54. The electronic components 52 represent electronic features commonly found in circuitry for computers or consumer electronics. The electronic components 52 may be sensitive to EM radiation. For example, EM radiation may cause the electronic components 52 to malfunction. FIG. 4B shows a conductive contact 56 located on a surface of the circuit board 54. During subsequent operation of the electronic device, the conductive contact 56 can be connected to a ground node of a power source to provide a grounding source for EM shielding.

FIG. 4C shows an optional electrically conductive pillar 58 located atop the conductive contact 56. The pillar 58 can structurally form a barrier that defines a boundary for a polymeric structure. For example, the width of the pillar can be elongated to form a dam, and the height of the pillar can be approximately equal to the height of one or more polymer layers of the polymeric structure. As such, the pillar 58 represents any electrically conductive physical structure with suitable dimensions to provide a barrier for the polymeric structure. During subsequent operation of the electronic device, the pillar 58 can be connected to the ground node of the power source through the conductive contact 56 to subsequently provide a grounding source for EM shielding of the electronic components 52.

In FIGS. 4D through 4F, a polymeric structure is then incorporated into the circuitry of the electronic device to enable EM shielding of the electronic components 52. In particular, FIG. 4D specifically shows an optional polymer layer 60 of the polymeric structure that is deposited over the electronic components 52. The pillar 58 creates a physical barrier that defines a boundary of the polymer layer 60. The polymer layer 60 electrically insulates the electronic components 52 and, as such, is referred to as an insulating polymer layer 60.

FIG. 4E shows another polymer layer 62 of the polymeric structure that is deposited over the insulating polymer layer 60. The polymer layer 62 is doped with sinterable particles and, as such, is referred to as a sinterable polymer layer 62. The pillar 58 also creates a physical barrier that defines a boundary of the sinterable polymer layer 62. In certain embodiments, the sinterable polymer layer 62 is deposited directly over the electronic components 52 without the intervening insulating polymer layer 60.

FIG. 4E also shows an external energy source 64 used to sinter the sinterable particles of the sinterable polymer layer 62. As shown, the external energy source 64 emits a laser beam onto the sinterable polymer layer 62. The laser beam activates the sinterable polymer layer 62 by providing sufficient energy to form a network of conductive pathways 66 from the sintered particles. Once activated, the sinterable polymer layer 62 can be referred to as a shielding polymer layer 62.

Lastly, FIG. 4F shows a complete polymeric structure including the shielding polymer layer 62 and the insulating polymer layer 60, which enclose the electronic components 52. When coupled to the grounded conductive contact 56 via the pillar 58, the polymeric structure can provide EM shielding for the electronic components 52 in accordance with a pattern of the network of conductive pathways 66.

Methods of fabricating the disclosed electronic devices can involve using a robotic system controlled by computer logic for high speed, high precision placement of components onto circuit boards for computers, consumer electronics, and the like. Examples of a computer-controlled robotic system include standard surface mount technology (SMT) component placement systems, which are commonly referred to as pick-and-place (P&P) machines.

The methods of fabricating the disclosed electronic devices can involve robots for dispensing the polymer layers. These robotic machines can be highly integrated and require minimal amount of hardware and/or software to achieve a dispensing mechanism that achieves sufficient quality. The disclosed polymeric structure is designed so as to enable use of these robotic mechanisms, standard SMT and circuit board design guidelines, equipment, and processes to augment standard electronic devices with EM shielding. As such, the disclosed electronic devices are less costly to fabricate compared to existing technologies and produce lighter weight structures compared to using metal housings as EM shields.

Figure 5:
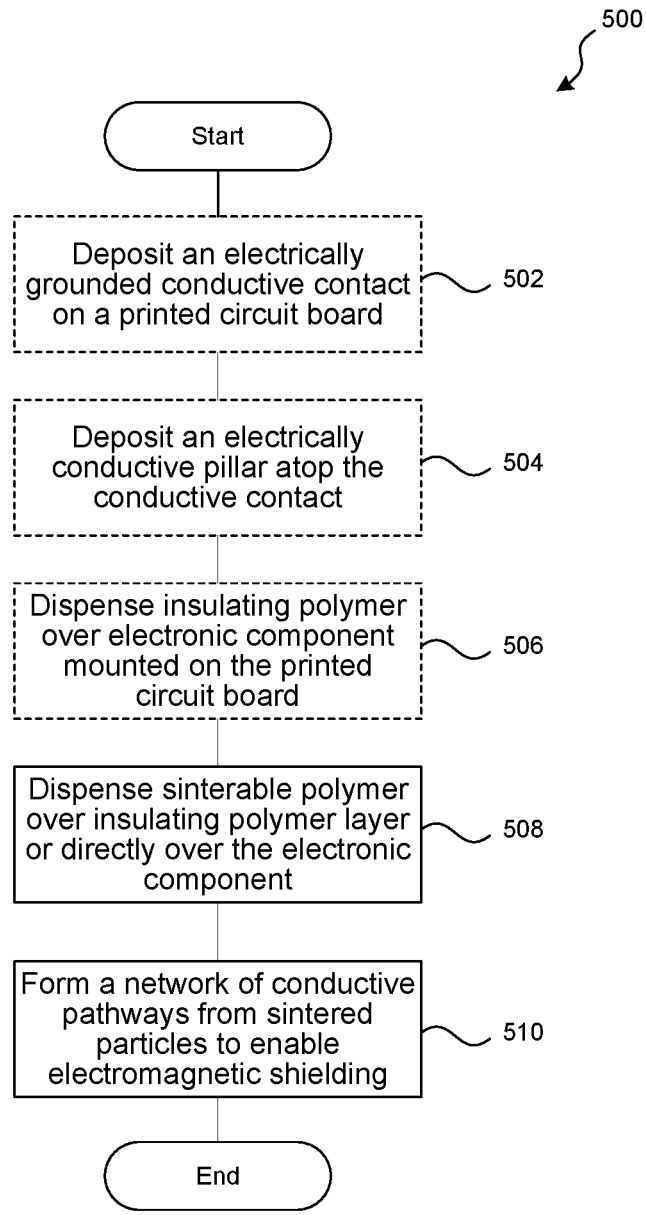
FIG. 5 illustrates an example of a method of fabricating an electronic device including a polymeric shielding structure.

FIG. 5 illustrates an example of a method 500 of fabricating an electronic device including a polymeric structure according to an embodiment. The method 500 augments circuitry of an electronic device with a polymeric structure to enable EM shielding of electronic components. For example, the electronic components can be mounted to a circuit board by using standard surface mount or chip on board (COB) techniques. However, any standard techniques, design guidelines, or processes can be used to build electronic circuitry. Moreover, the electronic components merely represent any component that could benefit from EM shielding.

In optional step 502, an electrically conductive contact is deposited on a circuit board. In certain embodiments, the conductive contact can be mounted on the circuit board by using a computer-controlled robotic system. However, the mechanisms for including the conductive contact in the electronic device are not so limited. Instead, any suitable mechanisms can be employed. For example, the conductive contact can be formed by pouring or spraying conductive material onto the circuit board, which can solidify upon cooling or can be cured at room temperature or with additional energy in the form of heat or EM radiation to form the conductive contact. The conductive contact can then be connected to a power source ground to subsequently provide grounding for the EM shielding.

In optional step 504, an electrically conductive pillar is deposited on the conductive contact. In certain embodiments, the conductive pillar can be mounted on the conductive contact by using a computer-controlled robotic system, or formed by pouring or spraying conductive material on the conductive contact, which hardens to form the conductive pillar. However, any other suitable mechanisms can be employed. Suitable mechanisms can allow for the conductive pillar to have a desired physical shape. For example, suitable mechanisms can allow the conductive pillar to have a height equal to the height of one or more polymer layers, if so desired. As such, the conductive pillar can form a structural barrier for subsequent polymer layers of the polymeric structure.

The polymeric structure is designed in a way to be easily dispensable and flow around and over components, covering the corners and edges of the components. For example, in optional step 506, a polymer material is dispensed over an electronic component mounted on the circuit board. Application of the polymer material may involve pouring or spraying the polymer material onto the electronic components. The polymer material can flow around some or all edges and corners of the electronic components. In certain embodiments, one or more conductive pillars can form a barrier that stops the polymer layer from flowing. The dispensed polymer layer can then solidify upon cooling or be cured at room temperature or with additional energy in the form of heat or EM radiation to form an insulating polymer layer.

In step 508, a polymer layer doped with sinterable particles is dispensed over the insulating polymer layer. Application of a sinterable polymer layer may involve pouring or spraying a polymer material doped with sinterable particles onto the insulating polymer layer to form the sinterable polymer layer. In certain embodiments, one or more conductive pillars can form a barrier that stops the polymer doped with sinterable particles from flowing. In certain embodiments, the sinterable polymer layer can be applied directly on the electronic components. As such, the sinterable polymer layer would be in physical contact with the electronic components.

Lastly, in step 510, an energy source is used to sinter the sinterable particles of the sinterable polymer layer. For example, the energy source can be a laser beam emitted from a laser diode onto the sinterable polymer layer. The EM energy of the laser beam activates a sintering action of the sinterable particles. The sintered particles form a network of conductive pathways in accordance with a path taken by the laser beam. The network of conductive pathways is electrically coupled to the conductive contacts directly and/or indirectly through the conductive pillars. Upon connecting the conductive contacts to a power source ground, the polymeric structure forms an EM shield for the electronic components.

In certain embodiments, a computer-controlled robotic machine can be used to control movement of the laser beam to draw the network of conductive pathways in accordance with a desired pattern, providing EM shielding from a selected frequency range. In certain embodiments, the energy source can be controlled to generate a laser beam having sufficient energy to form the network of conductive pathways on a surface without penetrating deeper into the sinterable polymer layer. This precise control of the energy source enables embodiments of a polymeric structure to have only one or multiple polymer layers. As such, the polymeric structure can be customized to include any number of polymer layers and provide EM shielding for any number of selected frequency ranges for different electronic components on the same circuit board.

In certain embodiments, any portion of the polymeric structure can be removed and replaced as needed without damaging the electronic components of the electronic device. The polymer composition of the polymeric structure facilitates removal of the polymer layers to uncover enclosed electronic components. Specifically, it is often necessary to repair or re-work electronic components during or after different manufacturing steps. As such, it may be necessary to remove the electrically conductive layer (e.g., the shielding polymer layer) and/or the electrically insulating layer (e.g., the insulating polymer layer) that have been deposited on the circuit board.

This can be achieved in any of at least three different ways:

(1) By selecting an electrically insulating polymer that has low adhesion to the circuit board and electronic components while still having good adhesion to the conductive polymer layer. Both the insulating and conductive materials may need to be selected together to ensure compatibility between the polymer resin systems (e.g., the polymeric structure) so that reduced adhesion is achieved to the circuit board while maintaining good adhesion between the insulating and conductive layers.

(2) By selecting an electrically insulating polymer and shielding polymer that can be removed at soldering temperatures, such that a soldering iron (hand-held or semi-automated workstation) can be used to "burn through" the materials, allowing the target components to be removed and replaced.

(3) By selecting an electrically insulating polymer and shielding polymer that are soluble in specific solvents, such that they can be removed in a solvent bath, allowing the target components to be removed and replaced. A solvent is chosen that does not have any damaging effects on the other components in the system.

Using any of the methods the electronic components can be repaired or replaced if necessary, and a new polymeric structure can be deposited over the repaired or replaced electronic components in accordance with the processes detailed above.

The machine-implemented operations described above can be implemented at least partially by programmable circuitry programmed/configured by software and/or firmware, or entirely by special-purpose circuitry, or by a combination of such forms. Such special-purpose circuitry (if any) can be in the form of, for example, one or more application-specific integrated circuits (ASICs), programmable logic devices (PLDs), field-programmable gate arrays (FPGAs), system-on-a-chip systems (SOCs), etc.

Software or firmware to implement the techniques introduced here may be stored on a machine-readable storage medium and may be executed by one or more general-purpose or special-purpose programmable microprocessors. A "machine-readable medium," as the term is used herein, includes any mechanism that can store information in a form accessible by a machine (a machine may be, for example, a computer, network device, cellular phone, personal digital assistant (PDA), manufacturing tool, any device with one or more processors, etc.). For example, a machine-accessible medium includes recordable/non-recordable media (e.g., read-only memory (ROM), random access memory (RAM), magnetic disk storage media, optical storage media, flash memory devices, etc.), among others.

The term "logic," as used herein, means: a) special-purpose hardwired circuitry, such as one or more application-specific integrated circuits (ASICs), programmable logic devices (PLDs), field-programmable gate arrays (FPGAs), or other similar device(s); b) programmable circuitry programmed with software and/or firmware, such as one or more programmed general-purpose microprocessors, digital signal processors (DSPs) and/or microcontrollers, system-on-a-chip systems (SOCs), or other similar device(s); or c) a combination of the forms mentioned in a) and b).

Examples of Certain Embodiments

Certain embodiments of the technology introduced herein are summarized in the following numbered examples:

1. An electronic device comprising: a circuit board; an electronic component mounted on the circuit board; a conductive contact disposed (e.g., deposited) on the circuit board and configured for connection to a power source ground; and a shielding polymer layer disposed over the electronic component and including a network of conductive pathways formed from sintered particles, the network of conductive pathways being electrically coupled to the conductive contact.

2. The electronic device of example 1, wherein the sintered particles are produced from non-electrically conductive sinterable particles exposed to sufficient energy to sinter the particles.

3. The electronic device of example 2, wherein the energy is electromagnetic energy selected from the group consisting of ultraviolet light, visible laser light, infrared light, x-rays, and microwaves.

4. The electronic device of any of examples 1 through 3, wherein the shielding polymer layer substantially encloses the electronic component.

5. The electronic device of any of examples 1 through 4, wherein the network of conductive pathways occupies an entire surface area of the shielding polymer layer.

6. The electronic device of any of examples 1 through 4, wherein the network of conductive pathways occupies less than an entire surface area of the shielding polymer layer.

7. The electronic device of any of examples 1 through 6, wherein the network of conductive pathways provides electromagnetic shielding of the electronic component for a selected frequency range.

8. The electronic device of example 7, wherein the selected frequency range is a function of a pattern formed by the network of conductive pathways.

9. The electronic device of any of examples 1 through 8, further comprising: a plurality of conductive contacts including the conductive contact; a plurality of electronic components including the electronic component; and a plurality of distinct networks of conductive pathways including the network of conductive pathways, each distinct network of conductive pathways being electrically coupled to a conductive contact on the circuit board and forming a respective pattern, the respective pattern enabling electromagnetic shielding of a respective electronic component for a selected frequency range.

10. The electronic device of any of examples 1 through 9, wherein the shielding polymer layer is in physical contact with the electronic component.

11. The electronic device of any of examples 1 through 10, further comprising: an insulating polymer layer disposed between the shielding polymer layer and the electronic component such that the insulating polymer layer electrically insulates the electronic component from the shielding polymer layer.

12. The electronic device of any of examples 1 through 11, further comprising: an electrically conductive pillar disposed between the shielding polymer layer and the conductive contact such that the network of conductive pathways is electrically coupled to the conductive contact through the electrically conductive pillar.

13. The electronic device of example 12, wherein the shielding polymer layer is disposed over an area of the circuit board and the pillar is located at a periphery of the area.

14. The electronic device of any of examples 11 through 13, wherein at least one of the shielding polymer layer or the insulating polymer layer comprises a thermally conductive filler that facilitates thermal conductivity between the electronic component and an ambient environment, the thermally conductive filler includes at least one of aluminum oxide, aluminum nitride, boron nitride, or diamond-based material.

15. The electronic device of any of examples 11 through 14, wherein the insulating polymer layer is a non-conductive dielectric material.

16. The electronic device of any of examples 11 through 15, wherein the insulating polymer layer comprises an adhesive that bonds the insulating polymer layer to the shielding polymer layer and the electronic component.

17. A method of fabricating an electronic device, the method comprising: applying a sinterable polymer layer over an electronic component mounted to a circuit board, the sinterable polymer layer including sinterable particles; and forming a network of conductive pathways by using electromagnetic energy to sinter the sinterable particles of the sinterable polymer layer, such that the network of conductive pathways becomes electrically coupled to a conductive contact on the circuit board to form a shielding polymer layer.

18. The method of example 17, further comprising, prior to applying the sinterable polymer layer: applying an insulating polymer layer over the electronic component, such that the insulating polymer layer electrically insulates the electronic component from the shielding polymer layer when the shielding polymer layer is formed.

19. The method of example 17 or example 18, further comprising, prior to applying the sinterable polymer layer: disposing an electrically conductive pillar on the conductive contact such that the network of conductive pathways is electrically coupled to the conductive contact through the electrically conductive pillar.

20. A method of fabricating an electronic device, the method comprising: forming a conductive contact on a circuit board, the conductive contact for connection to a power source ground node; forming an electrically conductive pillar atop the conductive contact; applying an insulating polymer layer over an electronic component mounted on the circuit board; applying a sinterable polymer layer over the insulating polymer layer, the sinterable polymer layer including sinterable particles; and forming a network of conductive pathways by using electromagnetic energy to sinter the sinterable particles of the sinterable polymer layer, such that the network of conductive pathways become electrically coupled to the conductive contact on the circuit board to form a shielding polymer layer.

Any or all of the features and functions described above can be combined with each other, except to the extent it may be otherwise stated above or to the extent that any such embodiments may be incompatible by virtue of their function or structure, as will be apparent to persons of ordinary skill in the art. Unless contrary to physical possibility, it is envisioned that (i) the methods/steps described herein may be performed in any sequence and/or in any combination, and that (ii) the components of respective embodiments may be combined in any manner.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims, and other equivalent features and acts are intended to be within the scope of the claims.

What is claimed is:
1. An electronic device comprising:
a circuit board;

an electronic component mounted on the circuit board;
a conductive contact disposed on the circuit board and configured for connection to a power source ground; and
a shielding polymer layer disposed over the electronic component and including a network of conductive pathways formed from sintered particles, wherein the network of conductive pathways is electrically coupled to the conductive contact and the sintered particles are produced from non-electrically conductive sinterable particles exposed to sufficient energy to sinter the particles, and wherein the network of conductive pathways provides electromagnetic shielding of the electronic component for a selected frequency range, the selected frequency range being a function of a pattern formed by the network of conductive pathways.

2. The electronic device of claim 1, wherein the sintered particles comprise a material that is sinterable by an electromagnetic energy including at least one of ultraviolet light, visible laser light, infrared light, x-rays, or microwaves.

3. The electronic device of claim 1 wherein the shielding polymer layer substantially encloses the electronic component.

4. The electronic device of claim 1 wherein the network of conductive pathways occupies an entire surface area of the shielding polymer layer.

5. An electronic device comprising:
a circuit board;
an electronic component mounted on the circuit board;
a conductive contact disposed on the circuit board and configured for connection to a power source ground; and
a shielding polymer layer disposed over the electronic component and including a network of conductive pathways formed from sintered particles, wherein the network of conductive pathways is electrically coupled to the conductive contact and occupies less than an entire surface area of the shielding polymer layer.

6. An electronic device comprising:
a circuit board;
a plurality of conductive contacts disposed on the circuit board and configured for connection to a power source ground;
a plurality of electronic components mounted on the circuit board; and
a shielding polymer layer disposed over the plurality of electronic components and including a plurality of distinct networks of conductive pathways formed from sintered particles, each distinct network of conductive pathways being electrically coupled to a conductive contact on the circuit board and forming a respective pattern, the respective pattern enabling electromagnetic shielding of a respective electronic component for a selected frequency range.

7. The electronic device of claim 1, wherein the shielding polymer layer is in physical contact with the electronic component.

8. The electronic device of claim 1 further comprising:
an insulating polymer layer disposed between the shielding polymer layer and the electronic component such that the insulating polymer layer electrically insulates the electronic component from the shielding polymer layer.

9. The electronic device of claim 8, further comprising:
an electrically conductive pillar disposed between the shielding polymer layer and the conductive contact such that the network of conductive pathways is electrically coupled to the conductive contact through the electrically conductive pillar.

10. The electronic device of claim 9, wherein the shielding polymer layer is disposed over an area of the circuit board and the pillar is located at a periphery of the area.

11. The electronic device of claim 8, wherein at least one of the shielding polymer layer or the insulating polymer layer comprises a thermally conductive filler that facilitates thermal conductivity between the electronic component and an ambient environment, the thermally conductive filler includes at least one of aluminum oxide, aluminum nitride, boron nitride, or diamond-based material.

12. The electronic device of claim 8, wherein the insulating polymer layer is a non-conductive dielectric material.

13. The electronic device of claim 8, wherein the insulating polymer layer comprises an adhesive that bonds the insulating polymer layer to the shielding polymer layer and the electronic component.

14. The electronic device of claim 5, further comprising:
an insulating polymer layer disposed between the shielding polymer layer and the electronic component such that the insulating polymer layer electrically insulates the electronic component from the shielding polymer layer.

15. The electronic device of claim 14, further comprising:
an electrically conductive pillar disposed between the shielding polymer layer and the conductive contact such that the network of conductive pathways is electrically coupled to the conductive contact through the electrically conductive pillar.

16. The electronic device of claim 6, further comprising:
an insulating polymer layer disposed between the shielding polymer layer and the plurality of electronic components such that the insulating polymer layer electrically insulates the plurality of electronic components from the shielding polymer layer.

17. The electronic device of claim 16, further comprising:
a plurality of electrically conductive pillars disposed between the shielding polymer layer and the plurality of conductive contacts such that a respective network of conductive pathways is electrically coupled to a respective conductive contact through a respective electrically conductive pillar.

* * * * *